United States Patent

[11] 3,599,326

[72] Inventor Simon DiRenzo
Philadelphia, Pa.
[21] Appl. No. 794,090
[22] Filed Jan. 27, 1969
[45] Patented Aug. 17, 1971
[73] Assignee Philco-Ford Corporation
Philadelphia, Pa.

[54] METHOD OF FORMING ELECTRICAL CONNECTIONS WITH SOLDER RESISTANT SURFACES
5 Claims, 6 Drawing Figs.

[52] U.S. Cl. .......... 29/626, 29/628, 29/488
[51] Int. Cl. .......... H05k 3/30
[50] Field of Search .......... 29/488, 578, 490, 625, 626, 628, 471.1, 492, 503; 228/39

[56] References Cited

UNITED STATES PATENTS

| | | | |
|---|---|---|---|
| 3,163,709 | 12/1964 | Fox | 339/17 C |
| 3,230,297 | 1/1966 | Means | 339/275 B |
| 3,249,910 | 5/1966 | Venn et al. | 174/88 |
| 3,499,220 | 3/1970 | Hintz et al. | 29/503 |

*Primary Examiner*—John F. Campbell
*Assistant Examiner*—D. M. Heist
*Attorney*—Carl H. Synnestvedt

ABSTRACT: A method of manufacturing printed circuit boards of the type having a plurality of contact pins projecting from one side thereof and adapted for use as wire wrap terminals connecting board-carried wiring to external circuits. The method includes selectively coating portions of the pins spaced from the board with a material to which solder will not adhere to maintain such portions free of solder, and in condition for making wire-wrap connections, followed by immersing the pins and adjacent board regions in molten solder to connect the pins to circuits carried by the board.

PATENTED AUG 17 1971

3,599,326

INVENTOR.
SIMON DiRENZO
BY
Harry W. Hargis III
AGENT

METHOD OF FORMING ELECTRICAL CONNECTIONS WITH SOLDER RESISTANT SURFACES

BACKGROUND OF THE INVENTION

This invention relates to electrical connections, and more particularly to a method of forming electrical connectors with solder resistant surfaces.

The availability of multilayer back panels and miniature connectors having closely spaced wire-wrap pins has made possible much greater packaging and wiring densities in many types of electronic equipment. Successful production of back panel assemblies of this type has posed difficult manufacturing problems, especially in soldering the closely spaced connector pins to the conductive pads of plated-through holes in the multilayer boards. Immersion soldering techniques were not thought to be satisfactory inasmuch as they had been found to leave solder residues which were detrimental to achievement of satisfactory wire-wrap connections.

A number of soldering methods have been directed to facilitating achievement of solder bonds that would not interfere with subsequently made wire-wrap connections. The methods have included placing of solder preforms on the connector pins, and solder-bonding either by heating the individual pins or by heating the entire assembly in an oven. These methods of bonding have been found, variously, to be time consuming, susceptible of damaging the wiring boards, and conducive to weak solder bonds due to characteristically low soldering temperatures.

It is an objective of this invention to provide an improved method for forming electrical connections of the aforementioned type, which method overcomes the above described difficulties, and makes it possible to utilize immersion-soldering techniques.

To the foregoing general ends, preferred practice of the present invention contemplates a method of manufacturing printed circuit boards of the type having a plurality of contact pins projecting from one side thereof, and which pins are adapted for use as wire wrap terminals connecting board-carried wiring to external circuits. The method includes selectively coating portions of the pins, spaced from the board, with a material to which solder will not adhere to maintain the portions free of solder and in condition for making of wire wrap connections, followed by subjecting the boards and pins to a bath of molten solder to connect the pins to the circuits carried by the board.

The manner in which the foregoing and other objectives of the invention may best be achieved will be more fully understood from a consideration of the ensuing description, taken with the accompanying drawing.

Figures 1, 2, 3, 4, 5:
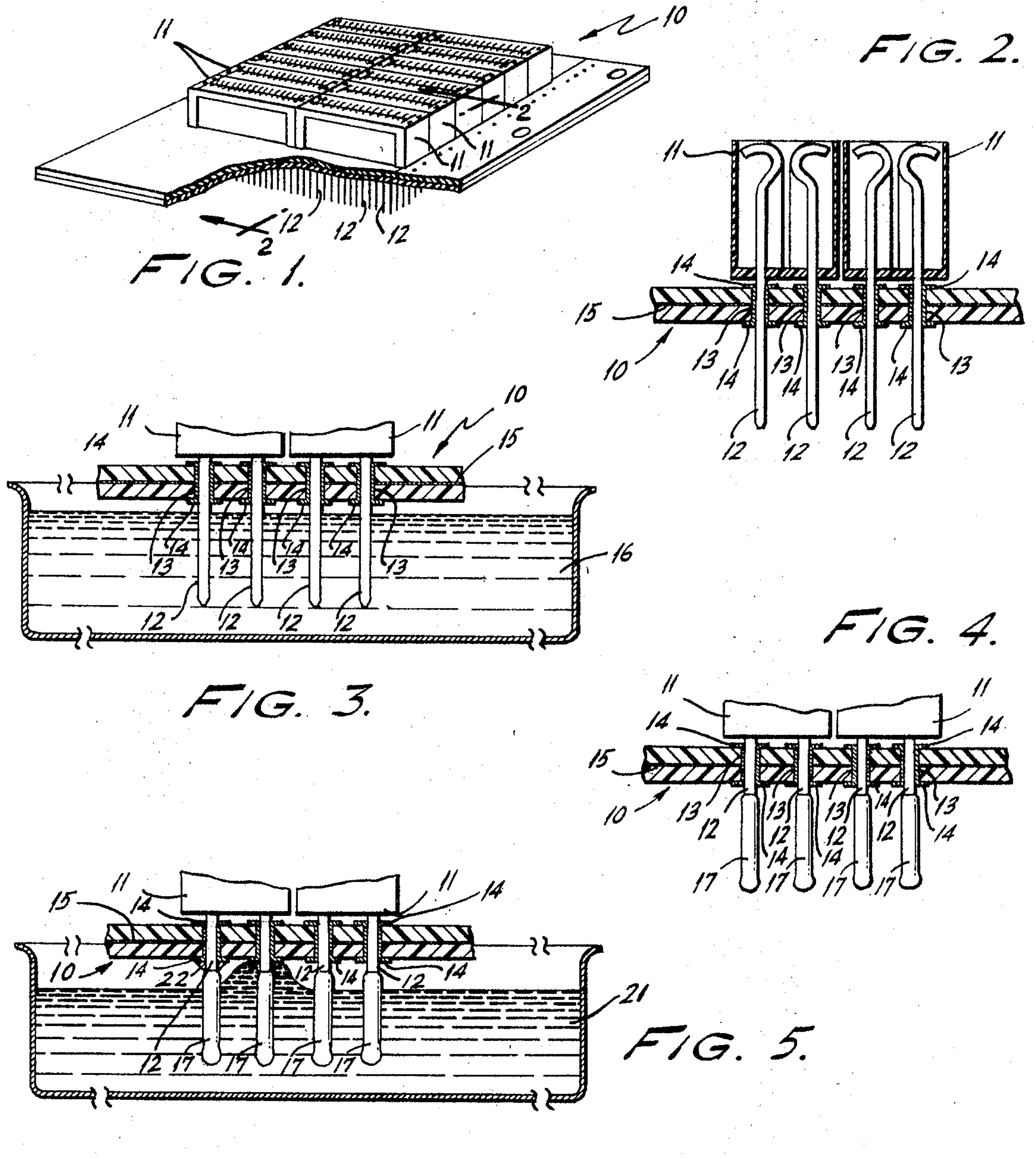
FIG. 1 is a partially fragmentary perspective showing of a printed wiring panel board on which the method of the invention may be practiced.
Figure 6:
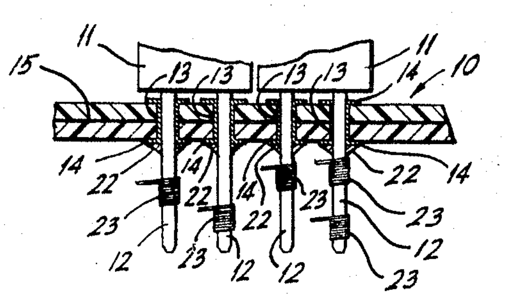

2 is an elevational showing, partly in section, of apparatus shown in FIG. 1;

FIGS. 3 and 4 are showings similar to FIG. 2, and illustrating initial steps in the method; and FIGS. 5 and 6 are views illustrating further steps in the method contemplated by the invention.

DESCRIPTION OF THE PREFERRED METHOD

With more particular reference to the drawing, and first to FIGS. 1 and 2, a multilayer wiring board 10 to be processed according to the invention has mounted thereon a quantity of sockets 11 for receiving and supporting smaller, component-carrying wiring boards (not shown) of conventional type. The sockets 11 include connector pins 12, preferably gold plated, extending therefrom through apertures defined by members 13 of conductive material, for example copper, provided with solder pads 14 at opposed ends thereof. Members 13 are electrically connected to multilayer circuit elements sandwiched between layers of the insulative board. Only one such element is shown, and is designated by the numeral 15. Base portions of selected pins 12 are electrically bonded to solder pads 14 of corresponding members 13, by means of the process fully described below.

The present invention is directed to a novel process or method for applying solder to complete the connections between pins 12 and pads 14 in such manner as to facilitate further interconnection of selected pins by wire wrap techniques. Considering that a square inch of board area may include about 50 pins of the type designated by the numeral 12, considerable care must be taken to ensure that the solder does not bridge between adjacent pads 14, and that the same solder does not create discontinuities in the gold-plated surfaces of the pins to which wire wrap connections are to be made.

In achievement of the objectives of the invention, and with reference to FIG. 3, it is proposed first to immerse the pins to within about one-sixteenth inch of the solder pads 14, in a bath comprising a liquid substance to which solder will not adhere. One such substance is sold under the trademark "Zipcote" and available from Adhesive Products Corp. "Zipcote" comprises an aqueous emulsion of polyvinyl butyrate, which dries to a clear plastic film. For purposes of the present invention, the "Zipcote" emulsion preferably is diluted with one part of water, by volume, to four parts of emulsion.

Following immersion of pins 12, board 10 is elevated to remove the pins from the solution. The board is held pinside-down, while hot air is directed, by known suitable means, onto the pins to dry the plastic coating. It is preferred to effect drying by holding a hot air gun nozzle about four inches from the pins while moving it slowly across the board from side-to-side. Satisfactory drying is usually achieved in about 5 minutes.

It is preferred to repeat the coating process until three layers of plastic have been applied. Following immersion for the final coating, a slightly longer drying period of about 10 minutes is preferred to achieve such curing of the coating as will enhance its solder-resist properties. The coated pins are illustrated in FIG. 4.

With reference to FIG. 5, board 10 is manipulated to subject the coated pins to a wave of molten solder, in a bath 21 of known type, and in the presence of a mild solder flux (not shown) such as rosin. Solder adheres only to the exposed, gold plated portions of pins 13 and to the adjacent pads 14, to form a fillet of about one-sixteenth inch as seen at 22 in FIGS. 5 and 6.

Having completed the soldering step, the plastic coating is removed from the pins by immersing the board and pin assembly in a solution comprising one part toluene and one part ethanol. Immersion is for about one-half hour, during which period most of the plastic coating is dissolved. The remainder is softened and may be removed by brushing, while the board is turned pinside-up in the solvent solution. A two-inch soft bristle brush moved across the pins in both directions has achieved satisfactory results. The board assembly is then blown dry, inspected, and subjected to further solvent treatments if deemed necessary. The solution may be colored to facilitate determination that the coating has been removed. For example, black coloring material of known type used to color anodized aluminum may be dissolved in the water, i.e. 25 grams of coloring material to one quart of water, before mixing and stirring into the "Zipcote" emulsion.

With further reference to FIG. 6, the desired wire wrap connections are made with ease, especially in view of the absence of solder from the free, gold-plated ends of pins 12. Prior art solder dipping processes have left small solder points, or "-flags," protruding transversely of the closely spaced pin tips. Such protrusions have a tendency to interfere with a programmed wire-wrap bit as it moves over a pin.

DESCRIPTION OF MODIFIED METHODS

The invention also contemplates selectively coating the gold plated pins 13 with a very thin layer of an electrically conductive, solder resistant substance that does not require removal. A coating of this type is advantageous in that it eliminates a solder-resist removal step, and also makes possible application of the coating to the pins prior to their assembly into a board since there are no appreciable changes in pin dimensions as a result of the relatively thin coating.

In this connection I contemplate applying such a coating by immersion of the gold plated pins in a nickel plating bath to apply a nickel coating of about .000025 inch thick, and leaving a 1/16 inch portion of the gold-plated pin base free of nickel plating to provide the desired solder bonding region. The assembly is then wave-soldered, as described in connection with the preferred method, whereupon the desired solder fillets are formed between the pads 14 and gold plated pin portions, and the nickel plated portions are left free of solder. Similar results are achievable utilizing selective chromium plating.

Still another method for applying a solder resistant coating comprises electroplating a layer of silver about .000025 inch thick on the gold plated pin to within about one-sixteenth inch of the solder pad. Again this leaves an exposed region of gold to which the solder will adhere. The assembly is then subjected to a hydrogen sulfide enriched atmosphere, whereby the silver coating is converted to silver sulfide which will reject solder during the wave soldering operation. The silver sulfide, although having the appearance of a highly tarnished surface, is conductive and the ensuing wire wrap connection is as effective as if made directly to the untreated gold plated pin surface. An atmosphere of ammonium sulfide has also been found satisfactory in achievement of the conversion to metallic sulfide.

From the foregoing it will be appreciated that the invention affords an improved way of forming electrical connections between closely spaced back panel solder pads and similarly spaced wire-wrap pins.

I claim:

1. A method of manufacturing circuit boards of the type having a plurality of closely spaced contact pins projecting from one side thereof in substantial parallelism and in regions of similarly closely spaced terminal means for circuit elements to which solder connections are to be made, and which pins have base portions soldered to said terminal means and free end portions adapted for use as wire wrap terminals connecting such board-carried circuit elements to external wiring circuits, said method including: selectively coating said free end portions only of the pins with a material to which solder will not adhere in order to maintain said free end portions devoid of solder in a subsequent dip soldering step, and in condition for making of wire wrap connections thereto; immersing both the coated and uncoated portions of said pins in a bath of molten solder, up to the level of said terminal means, to effect solder connection of the pins to the spaced terminal means on the board.

2. A method in accordance with claim 1, and further characterized in that said material is of high electrical conductivity.

3. The method according to claim 2 and further characterized in that said material of high electrical conductivity comprises chromium.

4. The method according to claim 2, and further characterized in that said material of high electrical conductivity comprises nickel.

5. The method according to claim 2, and further characterized in that said material of high electrical conductivity comprises a silver sulfide.

PO-1050
(5/69)

UNITED STATES PATENT OFFICE
CERTIFICATE OF CORRECTION

Patent No. 3,599,326 Dated August 17, 1971

Inventor(s) Simon DiRenzo

It is certified that error appears in the above-identified patent and that said Letters Patent are hereby corrected as shown below:

Column 4, line 22, after "board" insert -- ; and forming wire wrap connections on said coated free end portions of the pins -- .

Signed and sealed this 22nd day of February 1972.

(SEAL)
Attest:

EDWARD M.FLETCHER,JR.
Attesting Officer

ROBERT GOTTSCHALK
Commissioner of Patents